US006916396B2

(12) United States Patent
Kagoshima et al.

(10) Patent No.: US 6,916,396 B2
(45) Date of Patent: Jul. 12, 2005

(54) ETCHING SYSTEM AND ETCHING METHOD

(75) Inventors: Akira Kagoshima, Kudamatsu (JP); Motohiko Yoshigai, Hikari (JP); Hideyuki Yamamoto, Kudamatsu (JP); Daisuke Shiraishi, Kudamatsu (JP); Junichi Tanaka, Tsuchiura (JP); Kenji Tamaki, Yokohama (JP); Natsuyo Morioka, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 67 days.

(21) Appl. No.: 10/224,652

(22) Filed: Aug. 21, 2002

(65) Prior Publication Data

US 2003/0230551 A1 Dec. 18, 2003

(30) Foreign Application Priority Data

Jun. 14, 2002 (JP) ........................... P2002-174616

(51) Int. Cl.[7] .................. H05H 1/00; H01L 21/00
(52) U.S. Cl. ................. 156/345.24; 156/345.25; 438/5; 438/9
(58) Field of Search .............. 156/345.24, 345.25, 156/345.26, 345.27, 345.28; 118/695, 712, 696; 216/59, 60, 61; 438/5, 7–9, 14, 16

(56) References Cited

U.S. PATENT DOCUMENTS

| 5,642,296 | A | * | 6/1997 | Saxena | 702/84 |
| 5,685,942 | A | * | 11/1997 | Ishii | 156/345.48 |
| 5,711,843 | A | * | 1/1998 | Jahns | 156/345.24 |
| 5,910,011 | A | * | 6/1999 | Cruse | 438/16 |
| 5,971,591 | A | * | 10/1999 | Vona et al. | 700/220 |
| 6,197,116 | B1 | * | 3/2001 | Kosugi | 118/712 |
| 6,440,760 | B1 | * | 8/2002 | Cho et al. | 438/16 |

FOREIGN PATENT DOCUMENTS

JP          9-326382         12/1997

* cited by examiner

Primary Examiner—Parviz Hassanzadeh
(74) Attorney, Agent, or Firm—Antonelli, Terry, Stout & Kraus, LLP

(57) ABSTRACT

An etching system for subjecting a single film to be etched to etching involves a plurality of etching steps in which respective different recipes are applied. The etching system employs recipe generating means which fixes the recipe to be applied to the final etching step, affecting an underlying film making contact with the film to be etched, of the etching steps, to a preset recipe, and which generates a recipe to be applied to the residual etching step on the basis of the results of processing. Etching processing is conducted according to the recipes generated by the recipe generating means.

12 Claims, 11 Drawing Sheets

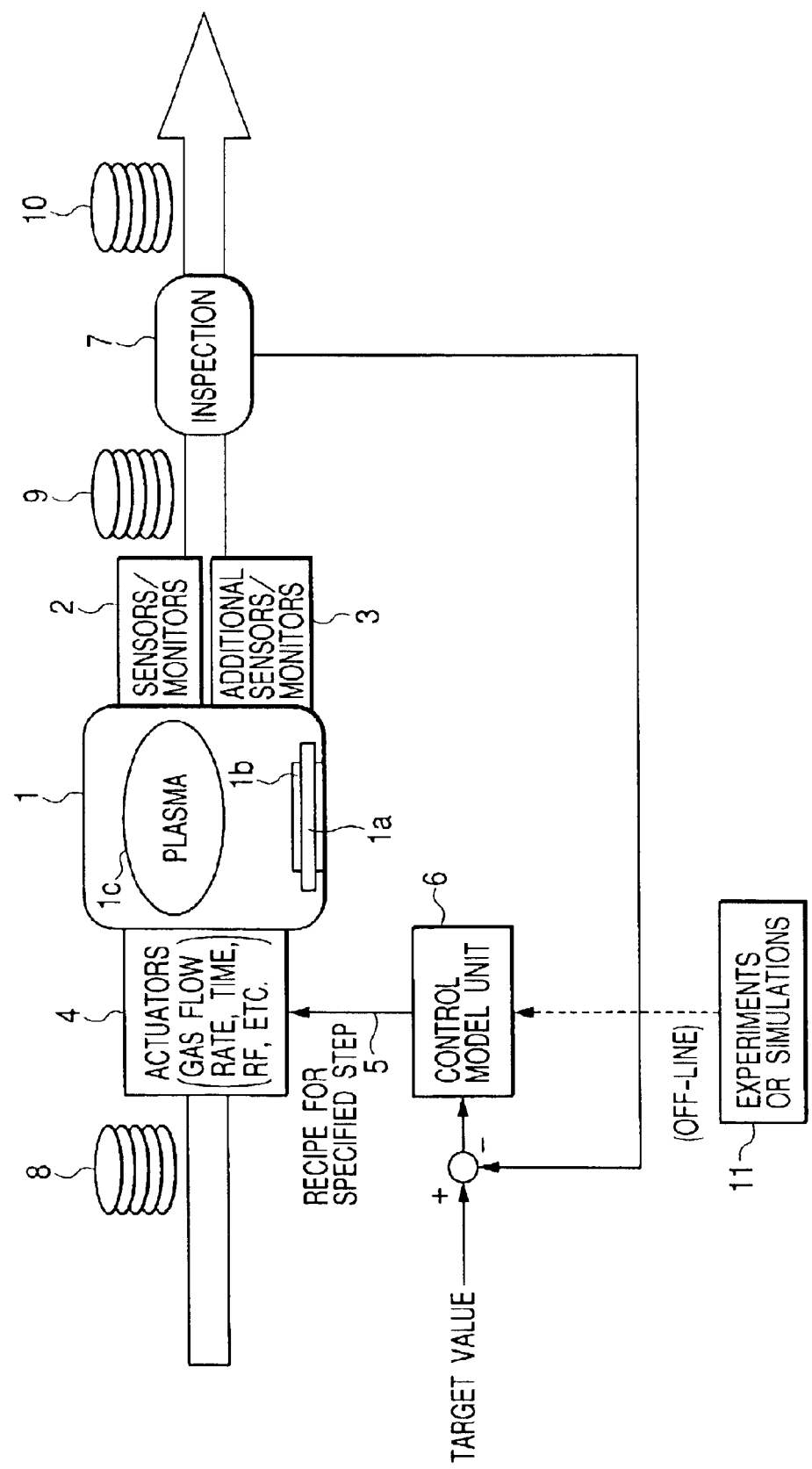

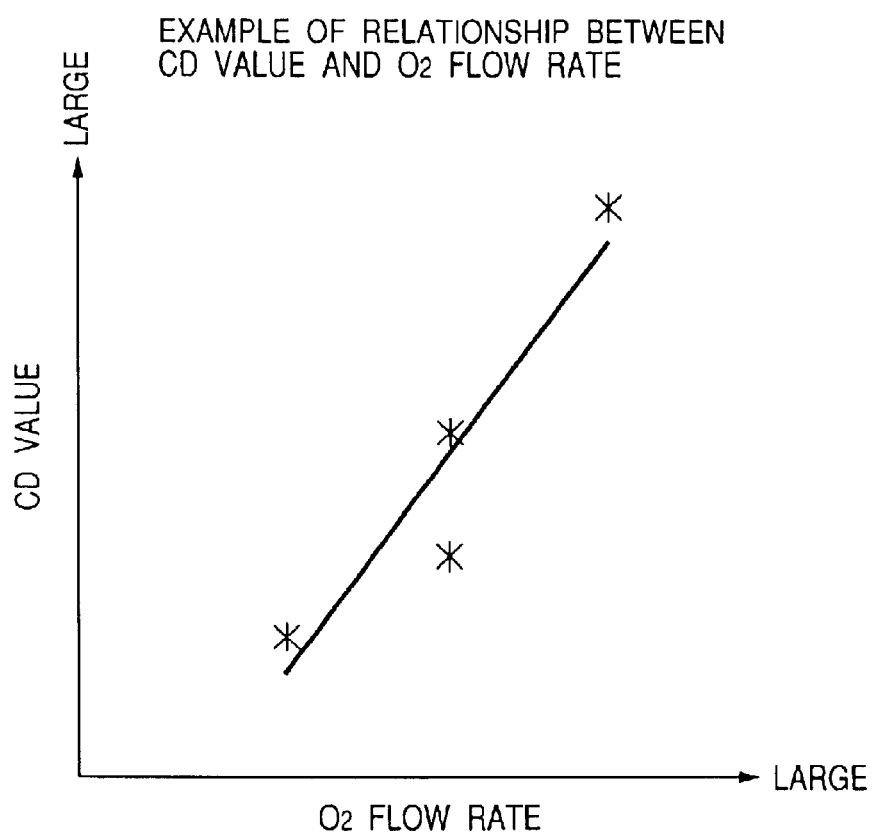

FIG. 5

RECIPE ADJUSTMENT METHOD

| STEP | Cl2 | HBr | O2 | PRESSURE | |
|------|-----|-----|-----|----------|---|
| BT | FIXED | FIXED | FIXED | FIXED | ⇨ STEP IN WHICH GATE INSULATION FILM IS NOT EXPOSED |
| ME1 | FIXED | FIXED | VARIABLE | FIXED | ⇨ STEP IN WHICH GATE INSULATION FILM IS NOT EXPOSED |
| ME2 | FIXED | FIXED | FIXED | FIXED | ⇨ STEP IN WHICH GATE INSULATION FILM WILL OR MAY BE EXPOSED |
| OE | FIXED | FIXED | FIXED | FIXED | ⇨ STEP IN WHICH GATE INSULATION FILM WILL OR MAY BE EXPOSED |

O2 = X [ml/min]

O2 = X−a [ml/min]

ETCHING SYSTEM AND ETCHING METHOD

BACKGROUND OF THE INVENTION

The present invention relates to an etching system and an etching method; and, more particularly, the invention relates to an etching system and an etching method that can suppress the influence of disturbances.

In an etching system using a plasma, for example, an etching gas is introduced into a vacuum process chamber, and a plasma discharge is produced under a reduced pressure; whereby, radicals or ions generated in the plasma are led to the surface of a wafer, which serves as the workpiece to be processed, and a reaction is caused at the wafer surface, thereby performing etching of the wafer surface. The etching system for performing such a processing (dry processing) is operated so as to carry out etching based on preset production conditions (gas flow rate, gas pressure, electric power supplied, etching time, etc.), hereinafter called a "recipe".

The recipe is generally maintained constant during a production step (an etching step for a single film to be etched) of a specified process, such as for the production of semiconductor devices, excluding a process for production of a photomask or the like, in which, for example, one process is divided into several steps and production conditions are modified on the basis of each step.

However, even if a fixed etching using a fixed recipe is carried out, various disturbances, such as those caused by a secular change in the system, make it difficult to constantly obtain a fixed performance. As a method of suppressing such disturbances, for example, Japanese Patent Application No. 2001-198830 discloses a technique in which the processed results are monitored and information is fed back to the recipe based on the monitored results.

In the case of monitoring the results of processing a specimen, such as a semiconductor wafer, and feeding back the monitored results to the recipe, the elements constituting the recipe include a number of parameters, such as gas flow rate, pressure, electric power supplied, and etching time. In order to specify an optimum parameter for control from among these parameters and build up a control model by use of the specified parameter, it is necessary to perform a number of experiments and simulations, which involve an enormous effort and a substantial amount of time.

In addition, even if the optimum control model is built up, unexpected side effects may be generated. For example, in a gate etching step for forming a gate electrode of an FET (Field Effect Transistor), etching which does not impair a thin gate insulation film, that is present beneath the film to be etched, is required for avoiding undesirable influences on the device performance. However, in the case where the characteristics of the system are varied in the direction of worsening the selectivity ratio between the film to be etched and the gate insulation film, as a result of the feedback of the monitored results to the recipe, the gate insulation film is also processed, with the result that the gate insulation film may be damaged.

That is, even where an attempt is made to restrain various disturbances by feedback control, realization of this objective in an actual production process requires an enormous effort and significant time, and, still, there is a fear of unexpected side effects.

SUMMARY OF THE INVENTION

The present invention has been made in view of the foregoing problems. Accordingly, it is an object of the present invention to provide an etching system and an etching method which can alleviate the fear of unexpected side effects, particularly when feedback control is performed, and in which it is possible build up a control model without an enormous expenditure of labor and time.

According to an aspect of the present invention, there is provided an etching system for subjecting a single film to be etched to etching, which employs a plurality of etching steps for applying respectively different recipes, wherein the etching system comprises a recipe generating means which fixes a recipe to be applied to the last etching step, affecting an underlying film making contact with the film to be etched, of the etching steps, to a preset recipe, and which generates recipes to be applied to the residual etching steps on the basis of processed results, and the etching is conducted according to the recipes generated by the recipe generating means.

BRIEF DESCRIPTION OF THE DRAWINGS

Other objects and advantages of the invention will become apparent from the following description of various embodiments, with reference to the accompanying drawings in which:

FIG. 3 is a schematic diagram which illustrates the processing conducted by the etching system;

FIG. 4 is a graph showing a CD value control characteristic relative to oxygen flow rate;

FIG. 5 is a diagram which illustrates a recipe adjustment method;

DESCRIPTION OF THE PREFERRED EMBODIMENTS

Figure 1:
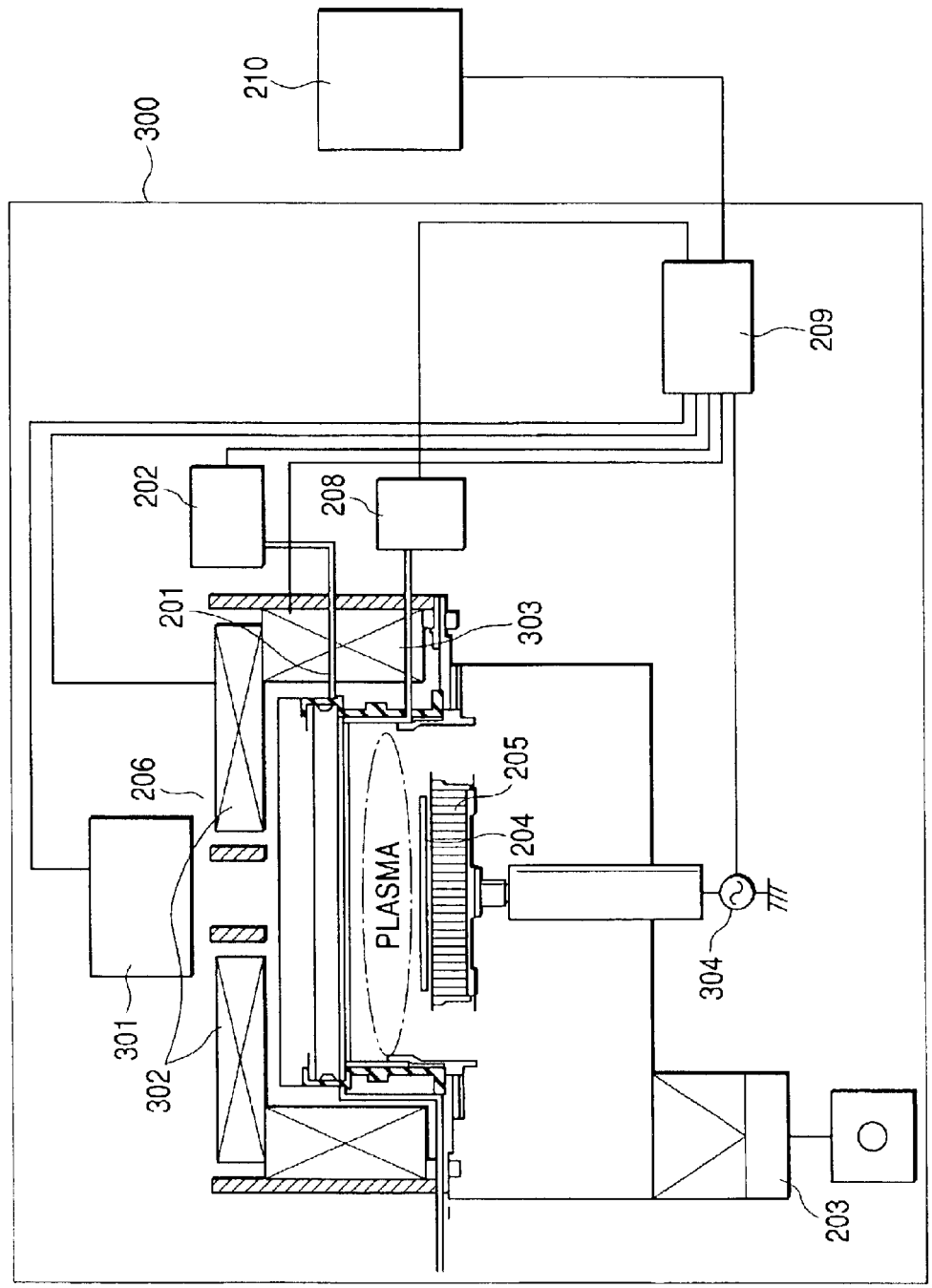
FIG. 1 is a schematic diagram of an etching system according to one embodiment of the present invention.

Preferred embodiments of the present invention will be described with reference to the accompanying drawings. FIG. 1 is an illustration of an etching system according to one embodiment of the present invention. In the figure, a main body 300 of the etching system comprises a process chamber (process vessel) 201, a gas supply means 202 for supplying a process gas into the process chamber, and a gas exhaust means 203 for exhausting the process gas and controlling the pressure in the process chamber. Further, a specimen table 205 for supporting a specimen 204, which serves as an object of processing, is provided in the process chamber 201, and a plasma generating means 206 for generating a plasma is provided in the process chamber.

The plasma generating means 206 comprises an electromagnetic wave supply means 301 which operates to transmit an electromagnetic wave into the process chamber 201, and solenoid coils 302, 303 for generating a magnetic field in the process chamber 201. A high frequency voltage is applied to the specimen table 205 from a high frequency power source 304 so that a reaction product produced by the plasma being generated is led toward the specimen.

This dry etching system is provided with a system condition detecting means 208. The system condition detecting means 208 comprises, for example, a monitor for detecting the flow rate of the gas supplied from the gas supply means 202, detectors for detecting the current and voltage in a feeder for supplying electric power for effecting generation of plasma, a detector for detecting the phase difference between the current and the voltage, detectors for detecting a progressive wave and a reflected wave of the high frequency electric power supplied for generation of plasma, and an impedance monitor.

The system condition detecting means 208 is provided with an analyzer for detecting and analyzing the light emitted from the plasma generated by the plasma generating means 206 in the process chamber 201. The system condition detecting means 208 is desirably a detector for outputting a multiplicity of signals, such as a spectroscope for outputting an emission spectrum resolved on a wavelength basis, but it also may be a detector for picking up light with a single wavelength, such as a monochromator. The emission spectrum which is produced as an output from the spectroscope is embodied in a signal indicating the light intensity on a wavelength basis. In addition, the system condition detecting means 208 may be a general plasma state monitor, such as a quadrupole mass spectroscopy. (QMS) apparatus for outputting a mass spectrum of the substances in the plasma.

Further, in this embodiment, there is a controller 209 for receiving the output from the system condition detecting means 208 and for controlling the operation of the system. The controller 209, for example, controls the supply and interruption of the electric power supplied to the plasma generating means 206, such as a magnetron or the like, for generating an electromagnetic wave or a magnetic field for generating a plasma, or it controls the electric power being supplied. Besides, it is also possible to control the output of the plasma being generated by use of other means. For example, the system condition detecting means 208 may detect certain reaction conditions, such as variations (increase and decrease) of a specified reaction quantity relevant to the processing, the reaction rate, the intensity of the plasma, etc., based on detection data obtained by detecting light with a predetermined wavelength that is generated during the processing of the specimen by use of the plasma, and instructions for the generation and stoppage of the plasma or for starting and stopping the system may be issued, whereby the operation of the system can be controlled.

In addition, the controller 209 can control the operation of the etching system by receiving an output from a detector 210 provided separately from or integrally with the etching system. The detector 210, for example, is generally a CD-SEM (scanning electron microscope) for measuring the processed shape upon etching, but it also may be a processed shape measuring means of the optical type, called a scatrometry device, which utilizes the scattering of light.

Figure 2:
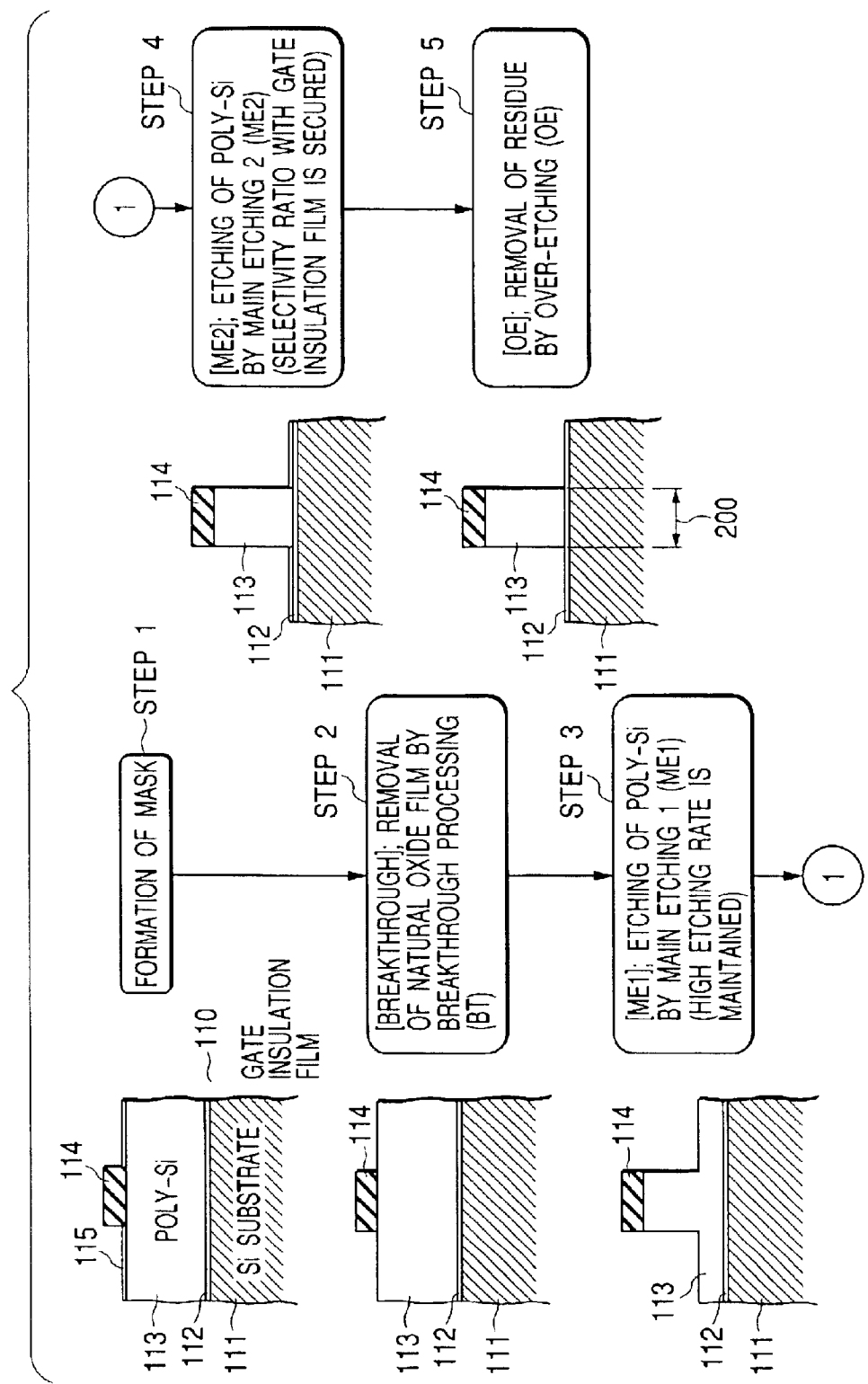
FIG. 2 is a process flow diagram which illustrates a gate electrode forming process.

FIG. 2 is a schematic diagram showing, on a process step basis, a gate electrode forming process in the case of a semiconductor device serving as an object of processing by the etching system according to the present embodiment. In the figure, there is a wafer 110 comprising a silicon substrate 111, a gate insulation film 112, and a polysilicon film 113, serving as a single film to be etched. The wafer 110 is provided with a mask 114, and a natural oxide film 115 is formed on the surface of the wafer.

The etching will be described with reference to FIG. 2. First, in Step 1, the wafer 110, provided with the mask 104, is prepared. Since the natural oxide film 115 is formed on the surface of the polysilicon 113 in areas not covered with the mask 104, removal (breakthrough) of the natural oxide film 115 is conducted in Step 2. In Step 3, an etching with a good shape is conducted by adopting a recipe for which a high etching rate can be maintained (main etching 1). In Step 4, a processing which will not affect the gate insulation film 112 is conducted by adopting a recipe for which a selectivity ratio between the polysilicon 113 and the gate insulation film 112 can be maintained (main etching 2). In Step 5, the residue of the film to be etched is removed by etching (over-etching).

In the above-mentioned etching process, the term "main etching" refers to the step of etching the film to be etched, excluding the step of removing the substance on the surface of the film to be etched, such as the natural oxide film (breakthrough), and the step of removing the residue of the film to be etched (over-etching).

Incidentally, in order to make it possible to attain a higher device speed and a lower power consumption, the gate length 200 shown in FIG. 2 has been decreasing year by year. The gate length of the device is an important dimension for determining the device characteristics, and, therefore, it is called a CD (Critical Dimension) value. As the gate length has decreased, the variations of the gate length allowed in gate etching also have decreased to the order of several nm, and there is an increasing need for an etching process by which the device can be produced with a stable gate length. In addition, with the miniaturization of the gate length, the gate insulation film has become increasingly thinner. For example, where the gate length is 100 nm, the thickness of the gate insulation film is about 2 nm. For such a gate insulation film, etching which does not damage the gate insulation film is required, so as to prevent deterioration of the insulation characteristics of the gate insulation film.

In general, in a dry etching system, the production conditions (gas flow rate, gas pressure, electric power supplied, etching time, etc.), called a recipe, are determined prior to the production (mass-production) so as to fulfill the requirements of dimension and shape of the work (specimen), namely, the object of processing. As has been described above, it is a common practice to maintain the recipe constant during the production (mass-production), excluding the process for producing a photomask. However, even if the etching is conducted by use of a fixed recipe, as above-mentioned, various disturbances, such as those caused by a secular change in the systems, make it difficult to constantly obtain fixed results of etching.

FIG. 3 illustrates the processing conducted by use of the etching system according to the present embodiment. In the figure, numeral 1 denotes a plasma etching process chamber for generating a plasma 1c therein, and symbol 1b denotes a wafer serving as the workpiece to be processed, which is mounted on a wafer stage 1a in the process chamber 1. Numeral 2 denotes sensors for monitoring the process quantities during processing, such as the flow rate and pressure of the gas supplied into the apparatus, or the electric power being supplied, and these sensors are generally standard equipment in the plasma etching system. Numeral 3 denotes additional sensors, for example, an OES (Optical Emission Spectroscopy) sensor for monitoring the spectrum of plasma light, a QMS (Quadrupole Mass Spectrometry) apparatus for analyzing the masses in the plasma, etc. Numeral 4 denotes actuators for controlling the etching system according to the recipe 5. Numeral 6 denotes a control model unit for calculating the recipe 5 based on the results of processing obtained from an inspection apparatus 7, whereby the recipe 5 can be modified on a wafer processing basis or during the processing.

The inspection apparatus 7 is ordinarily a CD-SEM, as a general choice, but it may be a scatrometry device (light scattering type shape measuring means) which is disposed separately from the etching system and which measures the dimensions and shape through scattering of light. This apparatus may be integrally incorporated into the etching processing apparatus.

The wafers 8 from the preceding step are supplied into the plasma etching process chamber 1. The wafers thus supplied are processed on the basis of a lot (a plurality of wafers) of to-be-etched wafers 9. The wafers 9 are supplied to the inspection apparatus 7, such as a CD-SEM, for inspection of the results of etching (processing). The wafers 10 thus inspected are then fed to the subsequent step. The result of inspection (CD value) produced by the inspection apparatus 7 is used to calculate the deviation thereof from a target value, and the calculation result is outputted to the control model unit 6. In the control model unit 6, a recipe for the wafers for the next processing, which uses roughly the same degree of processing, is calculated based on a CD value control model 11, that has been previously built up by use of experiments or simulations. According to the recipe thus calculated, the next etching is started.

A cause of anxiety in such a feedback control results from side effects of the control mentioned above. More specifically, in the gate etching step, etching is required to be carried out so as not to damage the thin gate insulation film beneath the film to be etched. However, where the control, including an adjustment of the recipe, as mentioned above, is performed, a variation in the direction of worsening the selectivity ratio between the film to be etched and the gate insulation film may occur; and, if this variation occurs, a side effect is generated in that the gate insulation film is also processed.

FIG. 4 is a diagram showing the CD value control characteristic relative to the oxygen ($O_2$) flow rate in the above-mentioned main etching 1. As shown in the diagram, there is a linear control characteristic, from which it is seen that the oxygen ($O_2$) flow rate in the main etching 1 is an effective control parameter for the control of the CD value. In addition, in the main etching 1, the gate insulation film is not exposed during the etching, and, therefore, it is unnecessary to take into account the side effect on the gate insulation film. While the control factor and the result are in a linear relationship in the example shown in FIG. 4, the present invention can be applied also to the case where the relationship is not linear.

In other words, in an etching control that is intended to constantly obtain fixed results in the possible presence of various disturbances, a control which will not damage the gate insulation film is conducted as follows. The recipes for the steps in which the gate insulation film might be exposed, such as the main etching 2 and the over-etching, are fixed; at least one of the steps in which the gate insulation film is not expected to (might not) be exposed, such as the breakthrough and the main etching 1, is selected as an object; at least one parameter in the object step is set to be a variable parameter; and feedback control (recipe adjustment) is conducted in relating to the variable parameter. For example, in the case where oxygen ($O_2$) is selected as a control parameter, as above-mentioned, the parameters in the recipe other than oxygen ($O_2$) in the main etching 1 (ME1) are fixed, and only the flow rate of oxygen ($O_2$) is set to be variable, as shown in FIG. 5.

Figure 6:
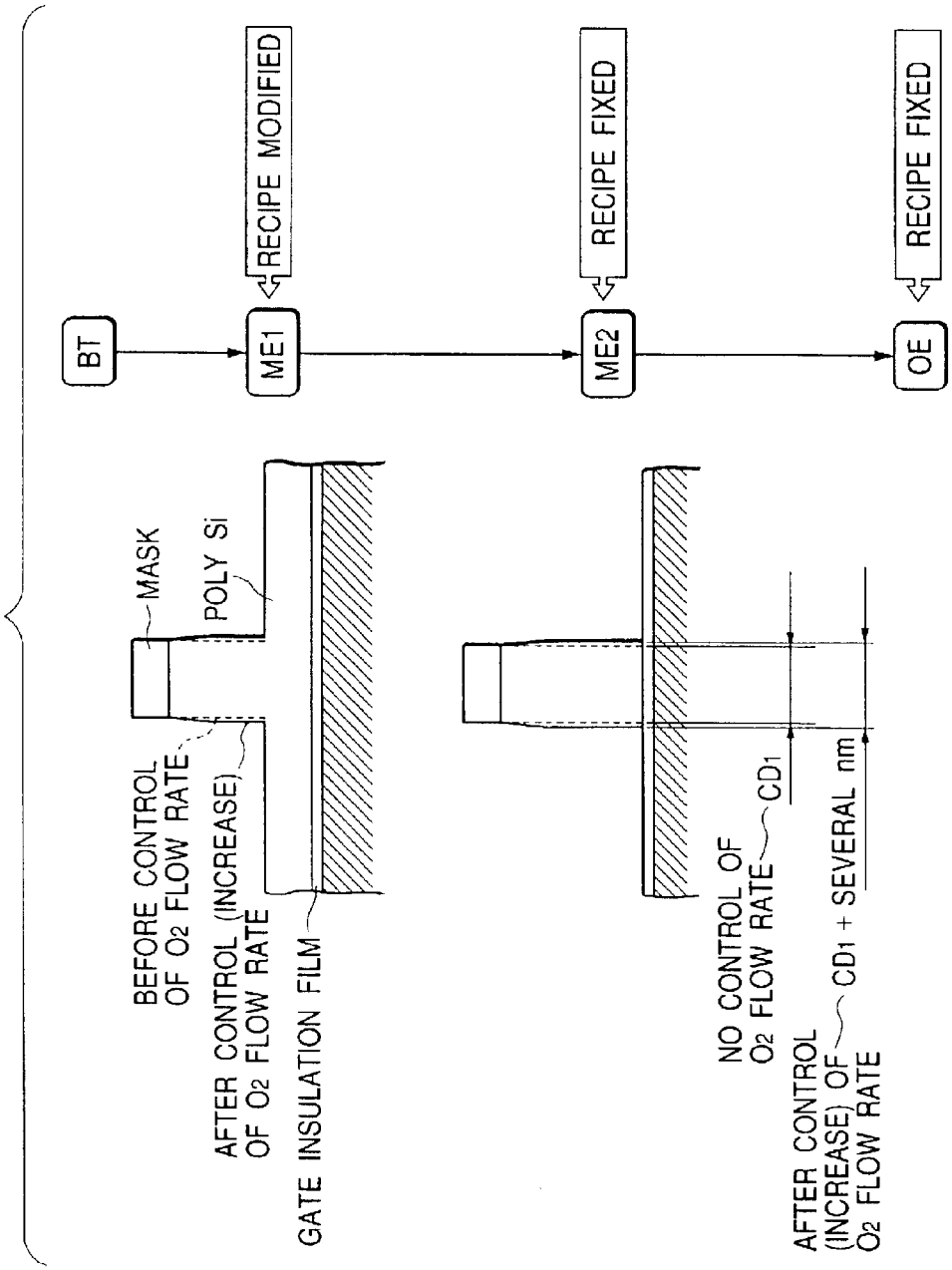
FIG. 6 is a diagram which illustrates a control mechanism for CD value at the time of varying the oxygen flow rate.

FIG. 6 illustrates the mechanism used in the control of the CD value when the flow rate of oxygen ($O_2$) is varied in the main etching 1. When the flow rate of oxygen ($O_2$) in the main etching 1 (etching of an upper layer portion of the film to be etched; ME1) is increased, build-up of the material to be etched onto the side walls is increased to form a side wall protective film. Therefore, the gate size (CD value) obtained after completion of the main etching is greater by about several nm than that before the increase in the flow rate of oxygen ($O_2$). Incidentally, the CD value can be reduced by decreasing the flow rate of oxygen ($O_2$) in reverse to the above.

Next, in the main etching 2 (etching of a lower layer portion of the film to be etched; ME2), the side wall protective film, that has been formed upon completion of the main etching 1, performs its function. Therefore, the initial size and shape in the main etching 2 succeed to the size and shape upon completion of the main etching 1, resulting in the CD value being greater by several nm.

The important part (CD value) of the gate length, which affects the device characteristics, is the size of the lowermost portion (skirt portion) of the polysilicon layer that is etched; therefore, it is important to stably process the size of that portion. Here, it is important that the flow rate of oxygen ($O_2$) as a variable parameter cannot be varied limitlessly. For example, when the CD value upon the preceding etching is smaller than the target value by about 10 nm, the required flow rate of oxygen ($O_2$) that is calculated, based on the CD control characteristic versus oxygen ($O_2$) flow rate shown in FIG. 4, exceeds a preset control range of the variable parameter (over-control). In this case, the flow rate of oxygen ($O_2$) cannot be increased according to the calculation result, because an excessive increase in the flow rate of oxygen ($O_2$) may generate another side effect which is material to the basis of device performance. Therefore, in the case of using the flow rate of oxygen ($O_2$) as a variable parameter, it is necessary to preliminarily set upper and lower limits of the flow rate, and to output an alarm, stop the etching or set the flow rate to the upper or lower limit thereof, when the flow rate of oxygen ($O_2$) obtained upon calculation of the recipe exceeds the upper or lower limit thereof.

While oxygen ($O_2$) has been selected as a variable parameter in the present embodiment, other factors may also be adopted as the variable parameter; for example, the etching time, the RF or pulse biased power applied to the substrate to be processed, the etching gas flow rate ratio ($Cl_2$/(HBr+$Cl_2$)) and the flow rate of an additive gas, such as $N_2$, may be adopted. Where the etching time is selected as the variable parameter, a film thickness monitor for monitoring the film thickness during processing may be used jointly, whereby a difference in initial film thickness can be accommodated. In the etching with such a high accuracy, which is an object of the present invention, it is desirable to devise a way to maintain the processed film thicknesses in all steps at set points by use of a film thickness monitor. Also, in the case of controlling these variable parameters, it is important to preliminarily set variable ranges of the variable parameters, for coping with over-control.

Figure 7:
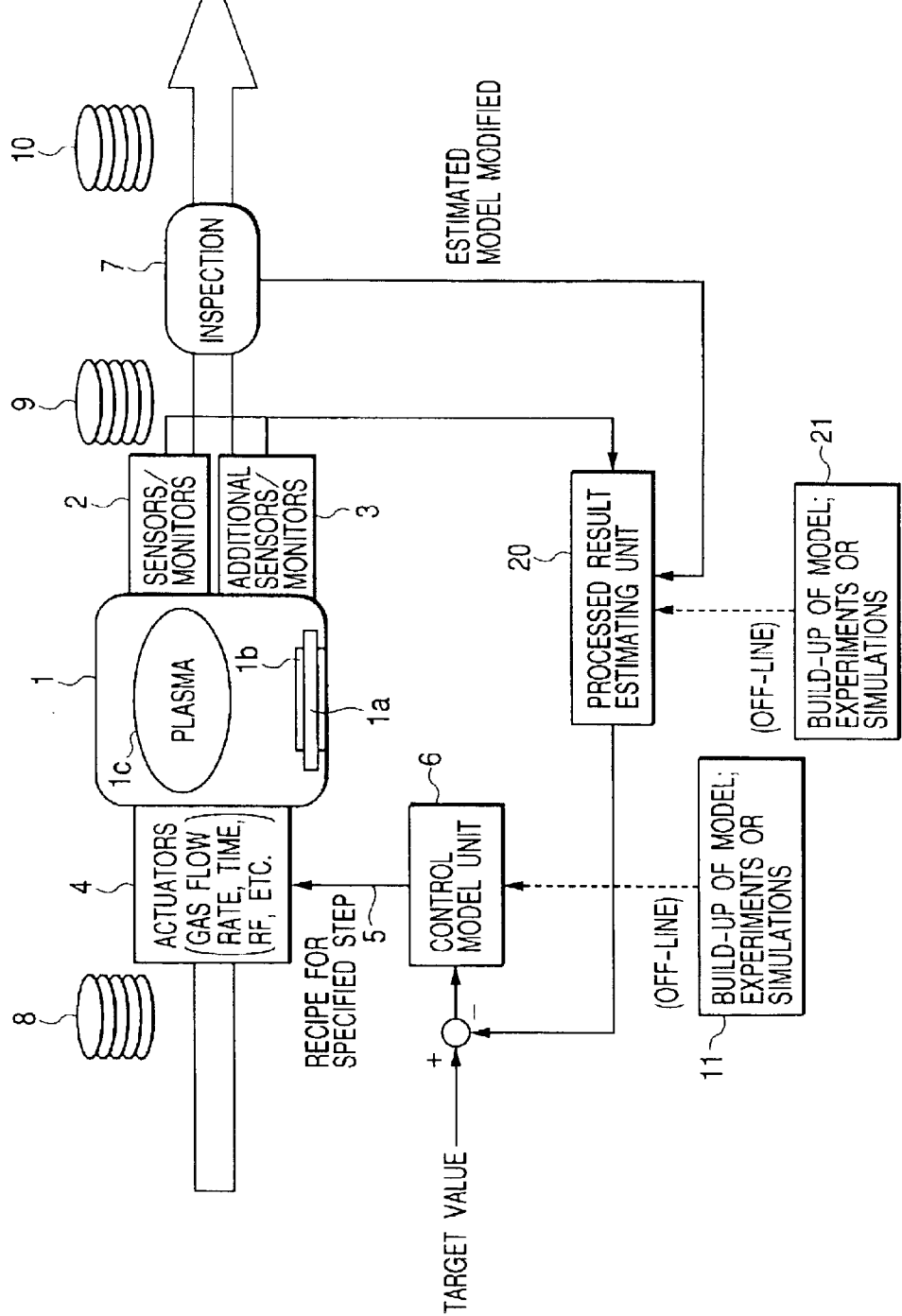
FIG. 7 is a schematic diagram which illustrates a modified example of the etching system.

FIG. 7 illustrates a modified example of the etching system according to the present embodiment. In the figure, the same portions as those shown in FIG. 3 are denoted by the same symbols, and the description thereof will be omitted. It is known that the results of an etching are in intimate relationship with the environments which exist in the process chamber during the etching. Therefore, by monitoring the conditions in the process chamber using the sensors 2 and the additional sensors 3, the processed conditions can be estimated on the basis of the monitored conditions by a processed result estimating unit 20. For estimation of the processed conditions, a prediction model 21, that has been built up based on the results of experiments or simulations preliminarily conducted, is used.

After being built up, the model is stored in the processed result estimating unit 20, and this model is corrected on the basis of measured values outputted from an inspection apparatus 7 for inspecting the results of the etching. Thus, the model accuracy can be enhanced.

A control model unit 6 adjusts a recipe for the same kind, or roughly the same kind, of wafers to be processed next, based on the deviation between the processed result that has been estimated as above-mentioned and a target value of the processed size of the process. In this case, the parameters to be adjusted are limited to the parameters in the etching steps which do not affect the gate insulation film. In the control model 6, a control algorithm is preliminarily built up by confirming control characteristics, such as, for example, shown in FIG. 4, by experiments or simulations conducted preliminarily.

Figure 8:
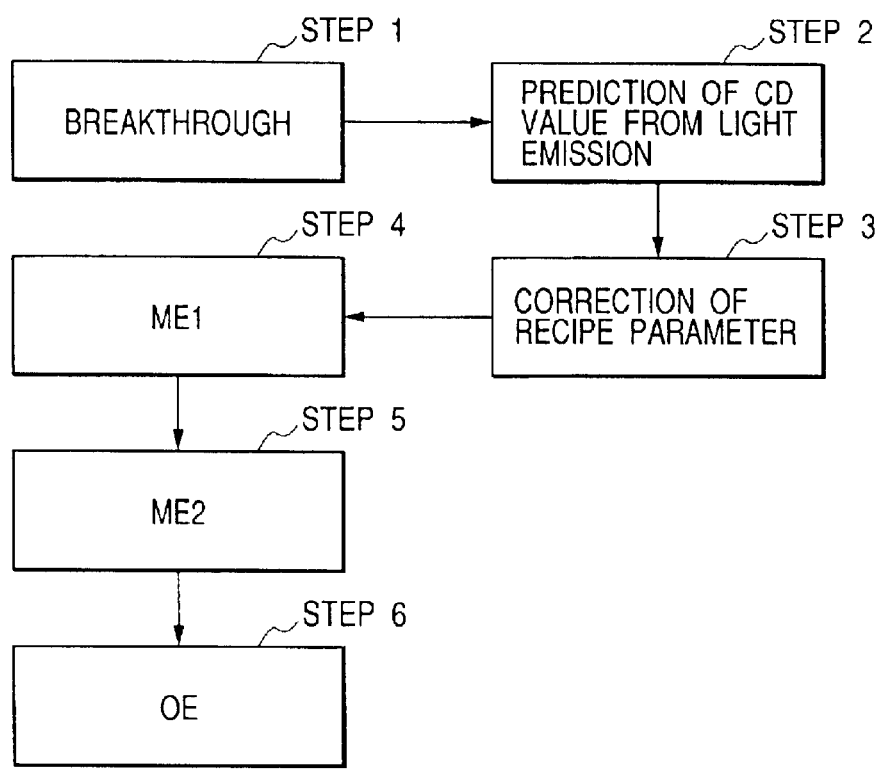
FIG. 8 is a flow diagram illustrating the flow for control of a CD value.

FIG. 8 shows an example of the flow for control of a CD value. In this example, the figure shows the flow for control of a CD value in the case where an OES sensor is used as the additional sensor 3 in the etching processing apparatus shown in FIG. 7. Each of steps will be described below.

In Step 1, a natural oxide film formed on the surface of the film to be etched is removed (breakthrough). In a predetermined period in this step, a plasma emission spectrum is collected by use of the OES sensor. In Step 2, the current system conditions are determined by use of the emission spectrum data, and the results of processing by the current system are predicted. Further, a recipe to be used in Step 4 is modified on the basis of the predicted results.

Specifically, the spectrum collected is immediately treated by use of multivariate analysis or a specified filter to calculate several indices, which serve as representative values of process condition monitors in Step 1. Next, based on the correlation between the preliminarily formed indices and the CD value, which is the final processed result, the result of the etching is estimated from the calculated indices. The advantage of this method is as follows. In the conventional control method, a specimen is processed, and the deviation of the processed shape from a reference value is measured, whereby it is only possible to stabilize the processing of the subsequent specimens. In this case, the time delay relating to the control is large, and many specimens are finished without their processing being corrected by the control. Further, in some cases where some variation as to the system occurs during the time when the control is delayed, the control itself becomes meaningless.

On the other hand, in the method of FIG. 8, the processed status of the specimen, which means as the object of control, is monitored, and a controlled variable is calculated from the monitored status, so that stable control with very high accuracy can be achieved.

In Step 3, based on the processed result estimated in Step 2, at least one parameter (variable parameter) in a recipe to be used in Step 4 is adjusted so that the result of the etching will coincide with the target value. In this case, when the adjusted parameter exceeds a preset adjustment range for the parameter, the parameter is set to the nearest value in the adjustment range, or the processing is interrupted and some alarm is issued to the user of the etching system. The variable parameter is not limited to the flow rate of oxygen ($O_2$). That is, the etching time, the RF or pulse biased power applied to the substrate to be processed, the etching gas flow rate ratio ($Cl_2/(HBr+Cl_2)$), and the flow rate of an additive gas, such as $N_2$, may also be adopted as the variable parameter. Where the etching time is adopted as the variable parameter, a film thickness monitor for monitoring the film thickness during processing may be used jointly, whereby differences in initial film thickness can be accommodated.

In Step 4, the film to be etched is etched by use of the recipe calculated in Step 3. In Step 5, the film to be etched is etched until the gate insulation film is exposed, using a recipe with a high selectivity ratio relative to the gate insulation film. In Step 6, the residual portion, which could not be etched away in Step 5, is etched (over-etching) for carrying out finishing by use of a recipe having a margin that will not damage the gate insulation film. In FIG. 8, it is intended to detect a variation of the processed condition in the processed condition which exists during the breakthrough step; however, the breakthrough step is short in time and is in may cases unstable, so that there are cases where the variation of the processed condition cannot be favorably detected.

Figure 9:
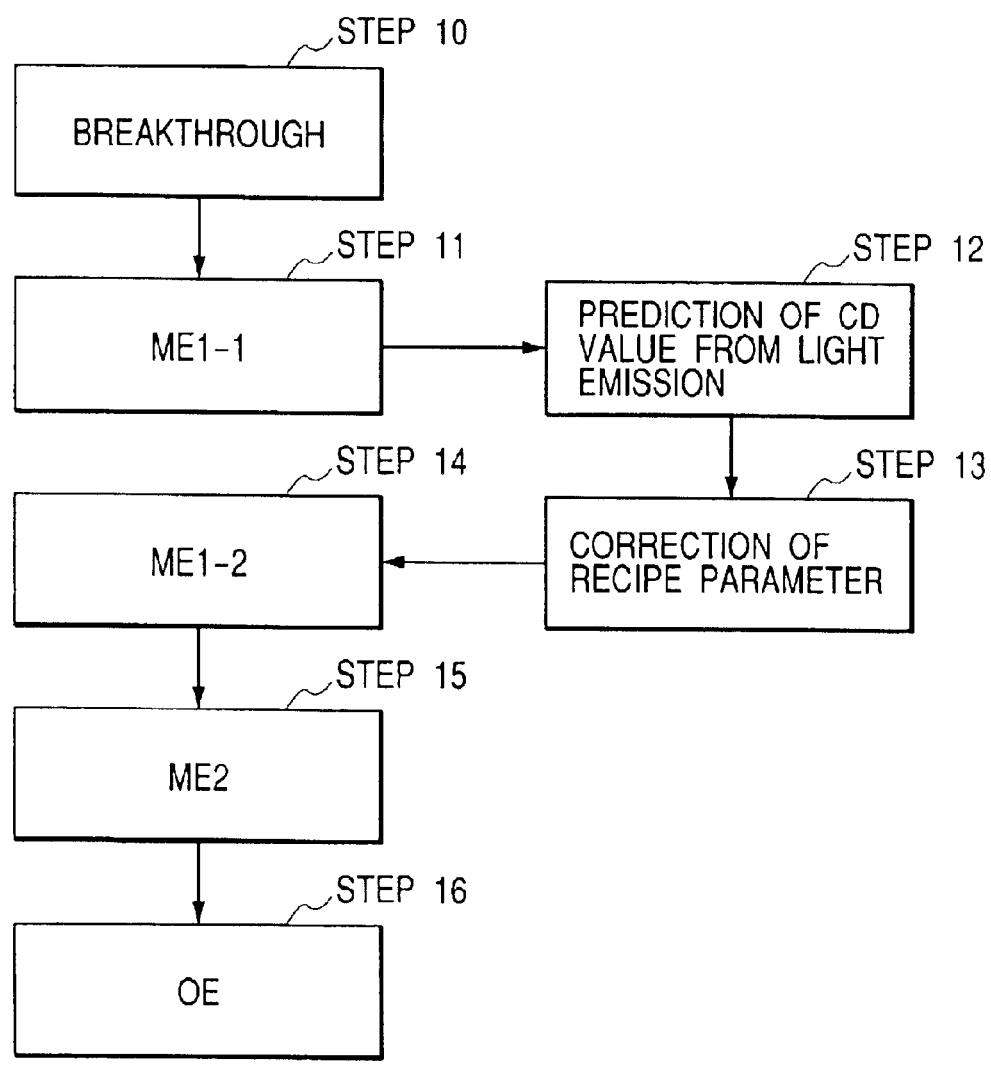
FIG. 9 is a flow diagram illustrating another example of the control flow for a CD value.

FIG. 9 illustrates an example of another control flow for the CD value, which is designed to cope with this problem. First, in Step 10, the natural oxide film formed on the surface of the film to be etched is removed (breakthrough). In Step 11, the film to be etched is etched. In a predetermined period during this step, a plasma emission spectrum is collected by use of an OES sensor. In Step 12, the current state conditions are determined by use of the emission spectrum data acquired in Step 11; the result of processing under the current system conditions is predicted; and the recipe to be used in Step 14 is modified.

Specifically, the spectrum thus collected is immediately treated by use of multivariate analysis or a specified filter to calculate several indices, which serve as representative values of a process condition monitor in Step 11. Next, based on the correlation between the indices and the CD value, serving as the final processed result, which has been preliminarily formed, the result of etching is estimated from the calculated indices.

In Step 13, based on the processed result estimated in Step 12, at least one parameter (variable parameter) in the recipe, which is to be used in Step 14, is adjusted so that the result of the etching will coincide with a target value. In this case, when the adjusted parameter exceeds a preset adjustment range for the parameter, the adjusted parameter is set at a nearest value in the adjustment range, or the processing is interrupted and some alarm is issued to the user of the etching system.

The variable parameter is not limited to the flow rate of oxygen ($O_2$); namely, the etching time, the RF or pulse biased power applied to the substrate to be processed, the etching gas flow rate ratio ($Cl_2/(HBr+Cl_2)$), and the flow rate of an additive gas, such as $N_2$, may also be adopted as the variable parameter. Where the etching time is adopted as the variable parameter, a film thickness monitor for monitoring the film thickness during processing may be used jointly, whereby differences in initial film thickness can be accommodated. In Step 14, the film to be etched is etched by use of the recipe calculated in Step 13. In Step 15, the film to be etched is etched until the gate insulation film is exposed, by use of a recipe with a high selectivity ratio relative to the gate insulation film. In Step 16, the residual portion which could not be etched away in Step 15 is etched for carrying out finishing (overetching) by use of a recipe having a margin that will not damage the gate insulation film.

Figure 10:
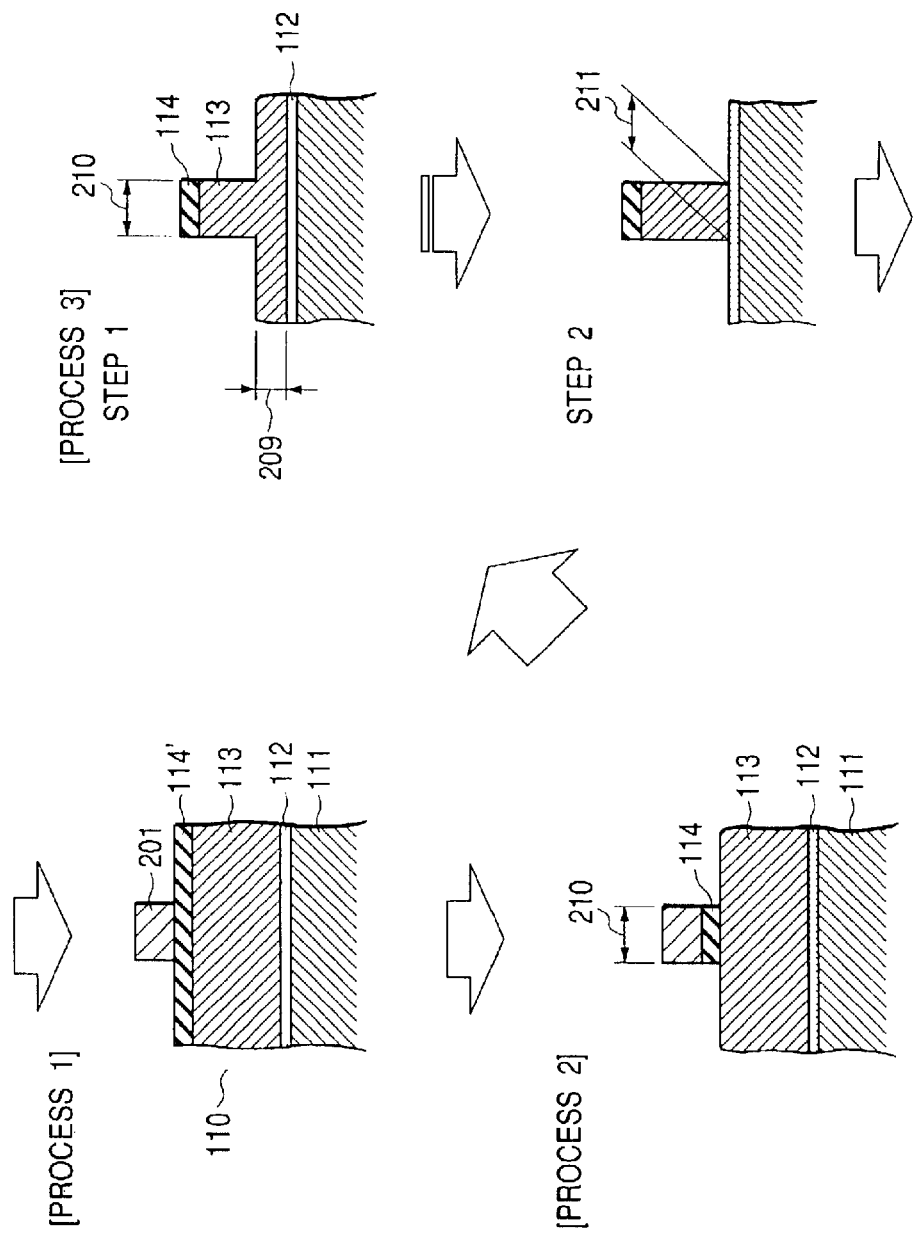
FIG. 10 is a process flow diagram which illustrates determinative factors for gate length.

FIG. 10 illustrates determinative factors for obtaining a determined gate length in the etching step. In the figure, the processing is sequentially conducted in the order of Process 1, Process 2, and Process 3 of FIG. 10, and the etching according to the present invention is sequentially conducted in the order to Step 1 and Step 2 of Process 3. In the figure showing these processes, numeral 110 denotes a wafer comprising a silicon substrate 111, a gate insulation film 112, and a polysilicon film 113. The wafer 110 is provided with a hard mask material layer 114' formed of $SiO_2$ or the like on the surface thereof, and a resist mask 201 is provided on the hard mask material layer 114'.

Process 1 is carried out in a photolithographic step in a process of fabricating a semiconductor, and shows the condition where the resist mask 201 is formed. Process 2 shows mainly a step of forming the hard mask 114 by etching the hard mask material layer 114' by use of an insulation film etching system, in an etching step in the process of fabricating the semiconductor. The hard mask 114 functions as a mask at the time of etching a gate material 113, consisting of a polysilicon film or the like, and it represents one of the factors which determine the final gate size. The resist mask 201 is removed after completion of this process.

Process 3 is a process to which the etching according to the present invention is applied. First, in Step 1, the polysilicon film 113 is etched away, up to a point before exposure of the gate insulation film 112, under etching conditions with a high etching rate, for example. During this etching, the residual film amount 209 of the polysilicon film 113 relative to the gate insulation film 112 is monitored by use of a film thickness monitor, whereby the residual film amount can be maintained constant on a wafer basis. Step 2 is a step of etching for carrying out finishing (over-etching) of the residual portion, which could not be etched away in Step 1, by use of a recipe having a margin that will not damage the gate insulation film.

For example, in Process 3 for processing the film to be etched in a plurality of steps, the mask size 210 of the hard mask 114 is varied due to process variations inherent in Process 1 or Process 2. Where the mask size 210 is formed to be greater in the preceding process, it may be contemplated to reduce the mask size 210 by anisotropic etching in Process 3. However, the hard mask 114 is formed of a material such as $SiO_2$ and SiON, so that it is difficult to reduce the mask size 210 by a gate etching step used in Process 3.

However, in the etching processing method according to the present embodiment, the mask size 210 is preliminarily acquired, and at least one parameter (variable parameter) in the recipe being used is adjusted, so that the result of etching will coincide with a target value, in Process 3; therefore, a desired gate length 211 can be obtained. Further, the processing can be performed without damaging the gate insulation film 112.

Even if the processing can be performed with the mask size 210 of the hard mask 114 constant for each time of processing in the preceding Processes 1 and 2, the mask size may be varied due to disturbances, such as a secular change of the system, in Process 3.

Even in such a case, according to the present embodiment, the amount of variation of the gate length 211 due to the disturbances is preliminarily acquired, and the recipe to be used in Process 3 is adjusted based on the amount of variation thus acquired, without any feedback to the preceding Processes 1 and 2, so that the desired gate length 211 can be obtained. Further, the processing can be performed without damaging the gate insulation film 112. In addition, in the case of performing a feedback to the preceding Process 1 or 2, a large-scale system is required. On the other hand, in the present embodiment, it is possible to cope with the problem by using only Process 3, so that the initial introduction burden (time, cost, etc.) of the production system can be alleviated.

Figure 11A:
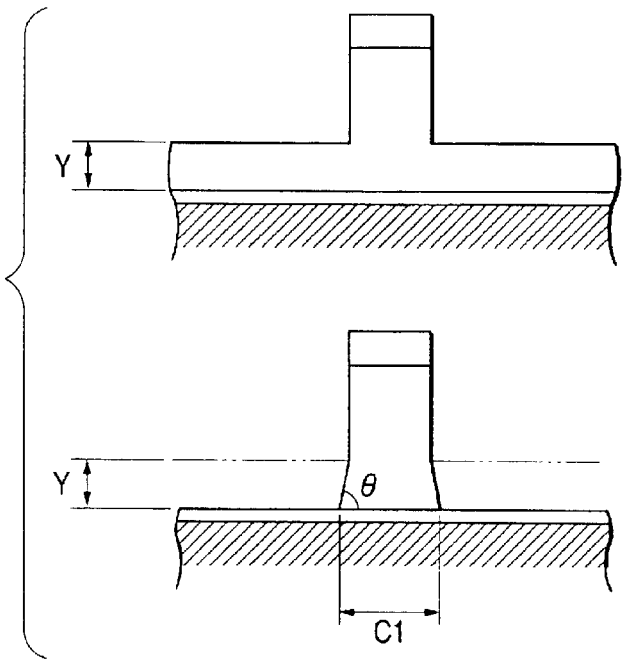
FIGS. 11(*a*) and 11(*b*) are diagrams which illustrate a method of using a film thickness monitor.
Figure 11B:
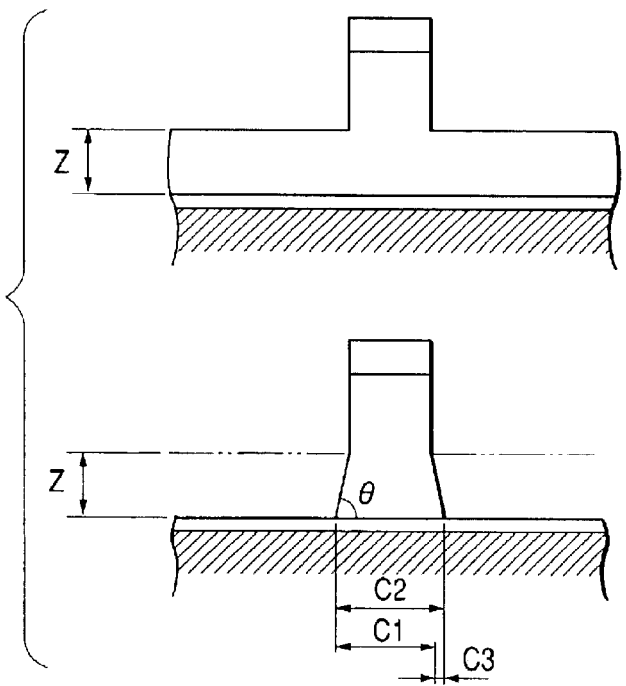

FIGS. 11(*a*) and 11(*b*) illustrate a method which involves the use a film thickness monitor. Here, the case of controlling the gate length by adjusting the $O_2$ flow rate in the recipe will be described as an example. FIG. 11(*a*) shows the process in the case where the flow rate of oxygen ($O_2$) is set to be °  2=X−a [ml/min], and FIG. 11(*b*) shows the process in the case where the flow rate of oxygen ($O_2$) is set to be $O_2$=X=a [ml/min].

In Step 1 of FIG. 11(*a*), etching is performed for a predetermined time at an oxygen ($O_2$) flow rate of X ml/min. In this case, the residual film thickness (the film thickness to the gate insulation film as foundation) is Y. Next, in Step 2, etching is conducted until reaching the foundation. In the etching in Step 2, etching proceeds at an angle θ according to the recipe being applied. Therefore, the final gate length is C1.

On the other hand, in the case of controlling the final gate length, etching is conducted at an oxygen ($O_2$) flow rate of X−a [ml/min] in Step 1, as shown in FIG. 11(*b*). In this case, although the gate length can be controlled, the etching rate is also varied. As a result, the residual film thickness in Step 1 is Z (Z>Y). In the subsequent Step 2, the recipe is fixed, so that the etching proceeds in the same manner as in the case of FIG. 11(*a*). That is, the etching proceeds at the predetermined angle θ. As a result, the final gate length is C2, which is different from the gate length C1 by C3 (this phenomenon can be utilized for controlling the CD value).

In other words, where it is intended to control the CD value by controlling the flow rate of oxygen ($O_2$) in Step 1 of FIG. 11(*b*), the etching rate in Step 1 is varied. In this case, if the effect of modification of the CD value in Step 2 is greater than the effect of modification of the CD value due to modification of the oxygen ($O_2$) flow rate in Step 1, the control of the CD value by modification of the oxygen ($O_2$) flow rate in Step 1 is hidden, resulting in an unexpected CD value being obtained.

Therefore, it is necessary to control the residual film thickness Y or the residual film thickness Z to a constantly fixed value. For this purpose, H is necessary to monitor the film thickness during the processing in Step 1 on a real-time basis.

While a polysilicon film has been taken as an example of the single film to be etched in the above description, the single film to be etched may be another film, for example, a laminate film with a metallic film.

According to the present invention, an etching system and method which can alleviate the fear of unexpected side effects, at the time of performing feedback control, and which allows a control model to be built up without using enormous labor and time, can be provided.

While the invention has been described with reference to various preferred embodiments, it is to be understood that the terms which have been used are terms of description rather than limitation and that changes within the purview of the appended claims may be made without departing from the true scope and spirit of the invention in its broader aspects.

What is claimed is:

1. An etching system for subjecting a single film to be etched to etching comprised of a plurality of etching steps based on respectively different recipes, comprising:

recipe generating means for generating and fixing a recipe which is a preset recipe to be applied to an etching step of the plurality of etching steps which affects an underlying film making contact with the single film to be etched, and for generating different recipes other than the preset recipe to be applied to other etching steps of the plurality of etching steps, wherein at least one of the different recipes for the other etching steps is generated on the basis of processed results;

wherein the etching system conducts etching of the single film according to the recipes generated by the recipe generating means.

2. An etching system as set forth in claim 1, wherein the recipe generating means generates the preset recipe to be applied to the etching step which affects the underlying film so as to enable the etching system to conduct etching with the preset recipe so as to expose the underlying film with substantially no damage thereto.

3. An etching system for subjecting a single film to be etched to etching comprised of a plurality of etching steps based on respectively different recipes, comprising:

recipe generating means for generating and fixing a recipe which is a preset recipe to be applied to an etching step of the plurality of etching steps which affects an underlying film making contact with the single film to be etched, and for generating different recipes other than the preset recipe to be applied to other etching steps, wherein at least one of the different recipes for the other etching steps is generated on the basis of a target value of processed results and a predicted value of processed results;

wherein the etching system conducts etching of the single film according to the recipes generated by the recipe generating means.

4. An etching system as set forth in claim 3, further comprising a processed result estimating means for estimating results of etching on the basis of an output signal from a monitor for detecting the conditions of the etching system and an estimation model formed on the basis of the monitor output signal and results of etching.

5. An etching system as set forth in any one of claims 1, 3, and 4, wherein the recipe generating means updates at least one parameter during etching for at least one of the other etching steps.

6. An etching system as set forth in any one of claims 1, 3, and 4, wherein the recipes generated by said recipe generating means for at least one of the other etching steps are generated by modifying at least one of oxygen gas flow rate, etching time, high-frequency electric power supplied to a process chamber, and chlorine gas ratio ($Cl_2/(HBr+Cl_2)$).

7. An etching system as set forth in any one of claims 1, 3, and 4, wherein the single film to be etched is one film of a laminate film which contacts the underlying film.

8. An etching system as set forth in claim 4, wherein the estimation model is generated on the basis of the correlation between a spectrum signal obtained by a plasma emission spectroscopic monitor for spectroscopically analyzing plasma emission in an etching process chamber and the results of etching.

9. An etching system as set forth in any one of claim 1, 3, 4 and 8, further comprising a film thickness monitor for monitoring the residual film thickness of said film to be etched, wherein processing according to said recipes generated by the recipe generating means is finished on the basis of an output from the film thickness monitor.

10. An etching system as set forth in claim 3, wherein the recipe generating means generates the preset recipe to be applied to the etching step which affects the underlying film so as to enable the etching system to conduct etching with the preset recipe so as to expose the underlying film with substantially no damage thereto.

11. An etching system for subjecting a single film to be etched to etching comprised of a plurality of etching steps based on respectively different recipes, comprising:

recipe generating means for generating a recipe to be applied to an etching step of the plurality of etching steps of the single film in reference to a target value of processed results and a predicted value of processed results for a previous etching step of the plurality of etching steps; and the etching system conducting the etching of the single film in at least the etching step in accordance with the recipe generated by the recipe generating means.

12. An etching system for subjecting a single film to be etched to etching comprised of a plurality of etching steps based on respectively different recipes, comprising:

recipe generating means for generating a corrected recipe for an etching step of the plurality of etching steps of the single film on the basis of a target value of processed results and a predicted value of processed results for at least another etching step conducted immediately before the etching step for applying etching with the corrected recipe of the plurality of etching steps; and the etching system conducting etching of the single film for the etching step of the plurality of etching steps in accordance with the corrected recipe generated by the recipe generating means.

* * * * *